United States Patent [19]
Gimzewski et al.

[11] Patent Number: 5,897,954
[45] Date of Patent: Apr. 27, 1999

[54] EPITAXIALLY LAYERED STRUCTURE

[75] Inventors: James K. Gimzewski, Ruschlikon; Thomas A. Jung, Thalwil; Reto R. Schlittler, Schonenberg, all of Switzerland

[73] Assignee: International Business Machines Corporation, Armonk, N.Y.

[21] Appl. No.: 08/678,009

[22] Filed: Jul. 10, 1996

[30] Foreign Application Priority Data

Jul. 24, 1995 [WO] WIPO ............... PCT/IBB95/005833

[51] Int. Cl.$^6$ ...................................... B32B 9/04
[52] U.S. Cl. ................ 428/411.1; 428/434; 428/450; 428/621; 428/622; 428/623; 428/624; 428/700; 540/145
[58] Field of Search ..................... 428/700, 624, 428/621, 622, 623, 434, 450, 411.1; 540/145

[56] References Cited

U.S. PATENT DOCUMENTS

| | | | |
|---|---|---|---|
| 4,812,352 | 3/1989 | Debe | 428/142 |
| 4,940,854 | 7/1990 | Debe | 428/411.1 |
| 5,356,831 | 10/1994 | Calviello et al. | 437/110 |
| 5,380,595 | 1/1995 | Ueba et al. | 428/408 |
| 5,385,116 | 1/1995 | Hattori et al. | 117/5 |

*Primary Examiner*—Paul Thibodeau
*Assistant Examiner*—Holly C. Rickman
*Attorney, Agent, or Firm*—Stephen S. Strunck

[57] ABSTRACT

A layer of conformationally adaptive organic molecules are used in epitaxially layered structures to accommodate lattice mismatch between layers at least one of which is of a nonorganic crystalline material. Such a layer on a substrate layer may constitute the epitaxially layered structure or the conformationally adaptive organic molecule layer may be used to accommodate a lattice mismatch between two other layers or the substrate and another layer.

13 Claims, 3 Drawing Sheets

EPITAXIALLY LAYERED STRUCTURE

The present invention is directed generally toward layered structures, in which one or several thin layers are mounted on a substrate. More specifically, this invention relates to epitaxially grown layers on a crystalline substrate, in particular providing a structure for compensating lattice mismatches between layers and substrates or between two layers of different materials.

BACKGROUND OF THE INVENTION

The preparation of thin epitaxial films on various substrates is an extremely important field in modern materials science and technology. Such films are applied for example in protective coatings, thin film devices, semiconducting devices, laser diodes, sensors, for data storage devices, and for mounting organic, including biological layers onto suitable substrates. The term "epitaxial" means the ordered growth of a material on the surface of a substrate or another layer, such that the crystalline properties and orientation of the deposited material reflects the orientation and crystalline structure of the substrate. Thus epitaxial deposition processes provide means to form thin specifically oriented crystalline layers.

A much addressed problem in epitaxial deposition is the one of lattice mismatch or misfit. Lattice mismatch occurs when the top and the bottom layer have different lattice constants. Deviations of less than 1 percent readily result in structural defects, including various types of dislocation, and the built-up strain in the deposited layer. These defects often affect the electronic properties of the grown layer in an often undesired manner. Accordingly, a number of solutions to this problem have been proposed in the art, including methods such as surface modification of the substrate by doping, ion implanting, or chemical reaction, deposition at elevated temperatures or of intermediate or buffer layers.

In the European Patent application EP-A-0 232 082, the substrate (Si) oriented in {100} direction is slightly tilted in the ffl001" direction to accommodate the lattice mismatch with GaAs. In addition to the tilting of the substrate, a buffer layer is provided to further reduce the misfit.

Another prior art approach utilizes the pseudomorphic growth of non-lattice-matched materials. In a system where there is sufficient attraction between the epilayer and the substrate and mismatch is low enough, initial epitaxial growth of a lattice mismatched material occurs two-dimensionally, with the epilayer conforming to the in-plane lattice structure of the substrate and with the mismatch accommodated by elastic strain. This growth is termed "commensurate" because it is growing with the lattice constant of the substrate, rather than with the unstrained bulk lattice constant of the epitaxial layer material. The commensurate growth is pseudomorphic as long as the layer thickness is below a critical thickness (which for a mismatch of 1–5% is about 1–100 nm) which defines the strain energy for which the introduction of dislocations becomes energetically favored.

The use of an intermediate layer is also disclosed in the U.S. Pat. No. 5,221,367. Here the growth of the intermediate layer is interrupted before the strain due to lattice mismatch is fully relieved by dislocations. The next layer is then grown in an unstrained and defect free condition where its lattice constant is about the same as the partially relieved lattice constant of the intermediate layer.

In yet another prior art approach, the desired lattice constant is obtained by growing several layers above their critical thickness, limiting however the change in lattice constant at each interface to about 1%. The grading from the lattice constant of the substrate material to the lattice constant of the final layer is in steps that are small enough to allow reliable two-dimensional growth throughout the growth process, This concept is for example pursued in U.S. Pat. No. 5,356,831, where a buffer layer is epitaxially grown on a ceramic substrate. The buffer layer has an elastically transitional lattice constant, matching at its lower surface the lattice constant of the ceramic substrate within a first given range, and matching at its upper surface the lattice constant of a following layer within a second given range. The buffer layer is provided by progressively growing a series of buffer layers of increasing lattice constant, each layer trapping its mismatch dislocations at its interface to the previous one, leaving its upper surface free of defects.

An effect known as "dislocation gettering" is applied in U.S. Pat. No. 5,294,808: If a heteroepitaxial layer is grown onto a sufficiently thin substrate, this effect causes any dislocations between the two layers to propagate into the substrate leaving the heteroepitaxial layer defect free.

To achieve an epitaxial growth of layers on a arbitrary, i.e. amorphous substrate, EP-A-0 352 931 teaches the use of a "seed" layer to be deposited onto the substrate before the deposition of a second (organic) crystalline layer.

However elaborated the above described solutions may be, in the art still the need is felt for an epitaxial structure accomodating a broad range of lattice constants and applicable to a variety of different materials.

SUMMARY OF THE INVENTION

The object of the invention is achieved by a structure and method as set forth in the appended claims.

It is seen as an essential feature of the structure in accordance with the invention to comprise at least one layer of conformationally adaptive molecules. A conformationally adaptive molecule is defined as being able to adapt itself to the substrate or a previously deposited layer by an internal rearrangement or reordering. In known deposition techniques, e.g., in the Self-Assembled Monolayer (SAM) techniques, a mismatch is accomodated by a tilting of the whole molecule. i.e. a translational or rotational movement of the entire molecule. The internal rearrangement however is seen to be based on rotations of side-groups, flexing, bending, and even weakening or breaking of molecular bonds.

Molecules having the necessary rotational or vibrational degrees of freedom can either be chosen from a large number of existing in particular organic molecules or can be synthesized for a specific substrate in accordance to well-known methods of chemistry. Too many internal degrees of freedom however may lead to an ill-defined structure of the layer. Suitable molecules are hence preferably chosen or synthesized such that the internal movement is confined by steric hindrance.

In a preferred embodiment, the conformationally adaptive molecule comprises a main unit to which at least three subunits or ligands are attached. Steric hindrance can preferably be achieved by choosing a molecular structure which prevents the subunits from freely swinging through/across a plane defined by the main unit. It is perhaps an instructive picture to view the subunits as flexible legs of the molecule. Preferably, the subunits are of a size and form such as to effectively shield the grown layer from the corrugation potential or electronic overlap of the substrate.

A particularly preferred class of molecules for use as conformationally adaptive molecules are cyclic or heterocyclic aromatic hydrocarbons, in particular selected from a group consisting of naphtalenes, phenanthrenes, perylenes, anthracenes, fullerenes, coronenes, pyrenes, phthalocyanines, porphyrines, carbazoles, purines, pterins, and derivatives thereof. The subunits can be chosen from a group comprising alkanes, benzene, and derivatives thereof. The subunits may also be derived from condensed polycyclic aromatic systems, such as phenanthrene, chrysene, or picene.

The films produced by using a conformationally adaptive layer have many of the same potential applications in optical and electronic devices as do thin films produced by molecular beam epitaxy (MBE), chemical vapor deposition (CVD), or Langmuir-Blodgett (LB) films. Part of these applications are for example described in a book by A. Ulman, titled "An Introduction to Ultrathin Organic Films", Academic Press, 1991. The possible applications range from passive thin films for use in tribology or lubrication, as lithographic resists, condensators, and insulators to active thin film devices, such as optical and biosensors, non-linear optical devices, photovoltaic cells, (luminescent) diodes, thin film transistors, in particular for use in displays, and field effect transistors. The layer of conformationally adaptive molecules on the substrate can constitute a the essential component of a device by an appropriate selection or design of the substrate and/or the molecules. Or the layer of conformationally adaptive molecules is used as intermediate layer between the substrate and another layer or between two layers, to accommodate a lattice constant mismatch.

These and other novel features believed characteristic of the invention are set forth in the appended claims. The invention itself however, as well a preferred mode of use, and further objects and advantageous thereof, will best be understood by reference to the following detailed description of illustrative embodiments when read in conjunction with the accompanying drawings.

DESCRIPTION OF THE DRAWINGS

The invention is described in detail below with reference to the following drawings.

DETAILED DESCRIPTION OF THE INVENTION

In the following an exemplatory way of preparing a conformationally adaptive layer on a substrate is described.

Figure 1:
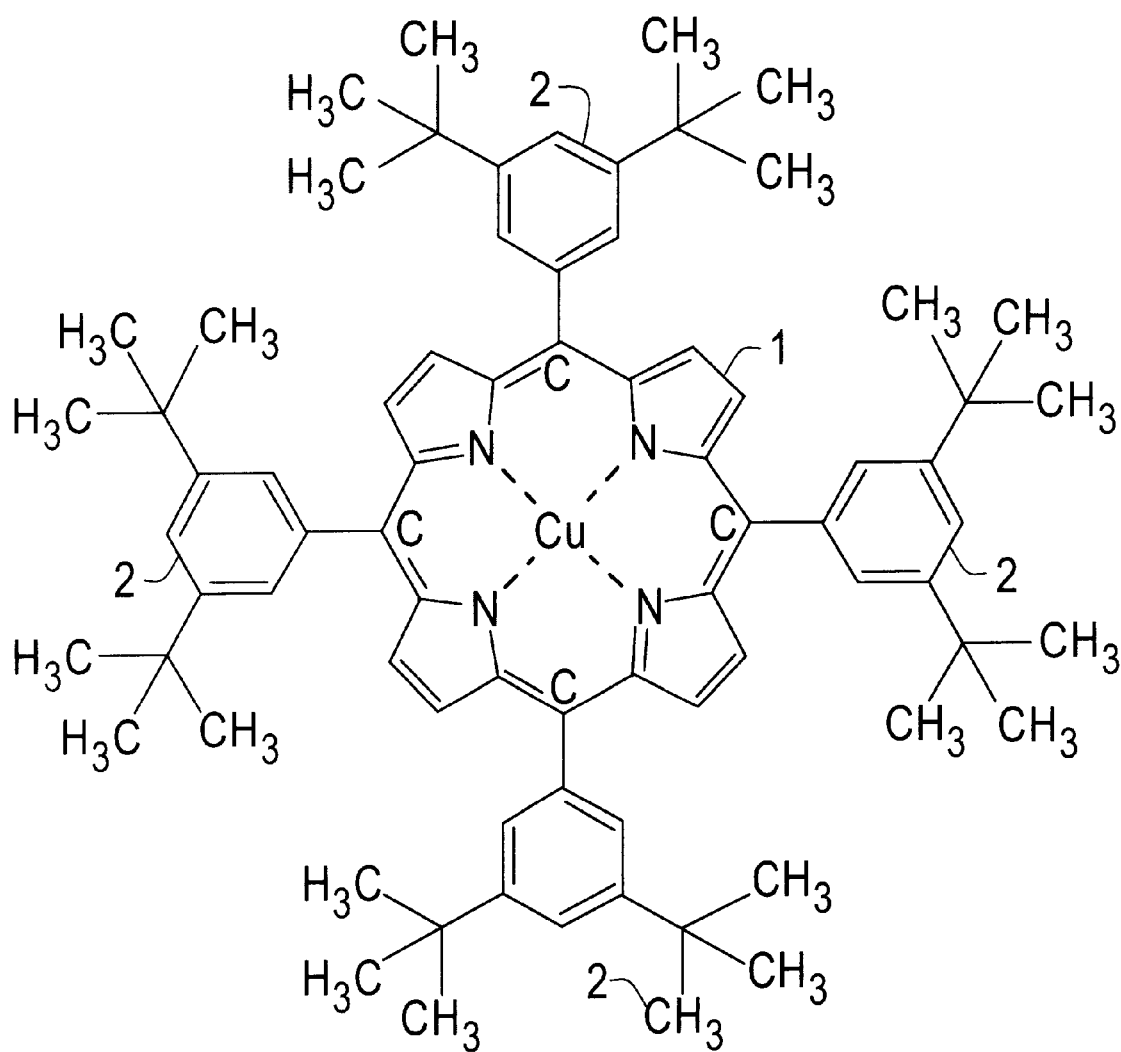
FIG. 1 shows the structural formula of a molecule forming a conformationally adaptive layer in accordance with the present invention.

The preparation is done in a ultra high vacuum chamber at a base pressure of below $10^{-10}$ mbar. A copper (Cu(100)) substrate is prepared by cycles of $Ne^+$ sputtering and annealing at 700K. In the conformationally adaptive molecule, a copper porphyrin complex is used as main group 1, to which di-tertiary-butyl phenyl groups are attached as subunits or side-groups 2 Cu-tetra-[3.5 di-tertiary-butylphenyl]-porphyrin (Cu-TPOB-Porphyrin). The structural formula of this complex is shown in FIG. 1. This porphyrin complex is sublimed at 360° C., holding the substrate at approximately 200° C. The sublimation of 10–15 percent of a monolayer coverage by Cu-TPOB-Porphyrin is monitored using a quartz crystal micro-balance.

The properties and characteristics of the sample monolayer are verified by a scanning tunneling microscope (STM). The STM characterization of such prepared samples reveals islands nucleating from step edges and on larger terraces of the substrate. Individual molecules appear as four clearly identifiable symmetric spots which can be assigned to the center of mass position of the tertiary butyl groups. The islands form a $\sqrt{58} \times \sqrt{58}$ superstructure in two domains with a ±23.2° rotation with respect to the Cu(100) orientation.

Using a similar sublimation techniques, films of other conformationally adaptive molecule, for example molecules consisting of a chlorophyll main group with four anthracene subunits as legs. Other possible examples of conformationally adaptive molecules, which can be deposited by sublimation, are 1,3,5-tri-(t-butyl)-benzene, n,n,n,n-tetra-(di-(t-butyl)phenyl)phthalocyanine, or a cage molecule (tetra-(t-butylsilyl)cubane), as synthesized by K. Furukawa, Appl. Phys. Lett. 60 (22), Jun. 1, 1992, 2744.

Figure 2:
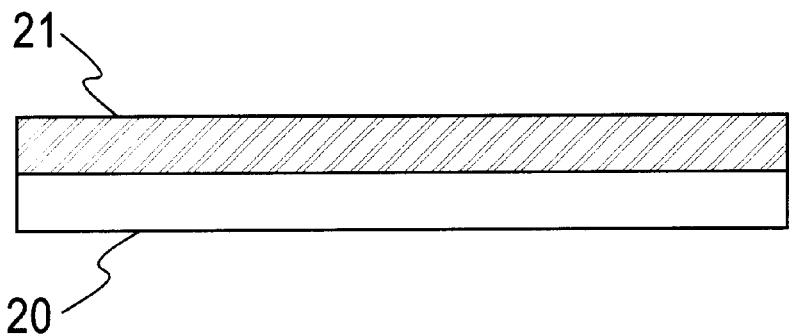
FIG. 2 shows schematically a conformationally adaptive layer in accordance with the invention used as lubricant.

In the following examples of possible application are given: A thin film 21 of Cu-TPOB-Porphyrin of 1 to 5 monolayers (ML) on a (metallic) surface 20, as shown in FIG. 2, significantly reduces its static and sliding friction. With two surfaces, each covered by at least a single monolayer, the friction can be reduced by a factor of 10. Optimized conformationally adaptive layers 21 may hence be advantageously exploited as protective coatings for magnetic tapes and disks as are currently encountered in data storage and video recording.

Figure 3:
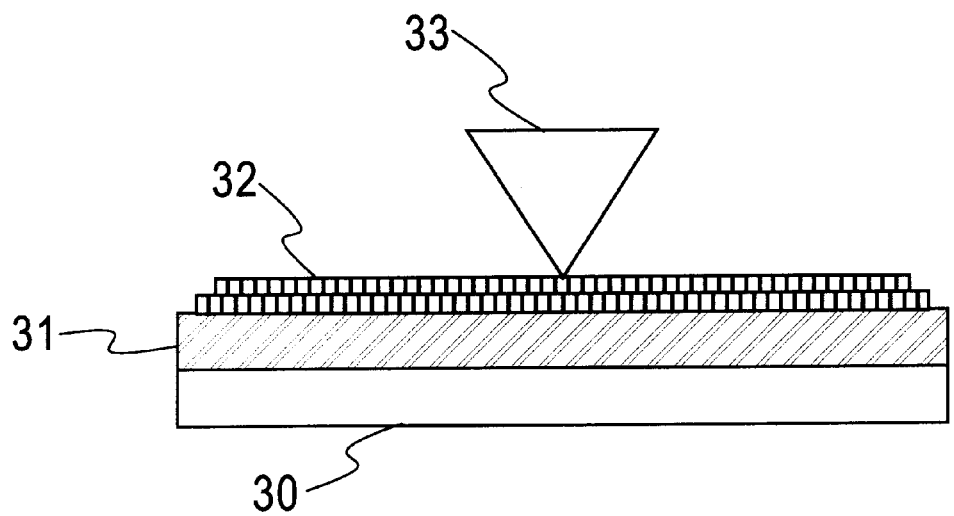
FIG. 3 shows schematically a conformationally adaptive layer in accordance with the invention used within a diode structure.

Referring now to FIG. 3, a thin film diode is produced based on the current invention by applying 1 to 3 ML of Cu-TPOB-Porphyrin 31 onto a substrate 30 of Cu. On top of the Cu-TPOB-Porphyrin an electron accepting layer 32, in this example $C_{60}$, is deposited by sublimation in vacuum having a thickness of 1–2 ML. Contact to the diode is made through the tip 33 of an STM and by contacting the Cu substrate via a UHV feed-through.

Figure 4:
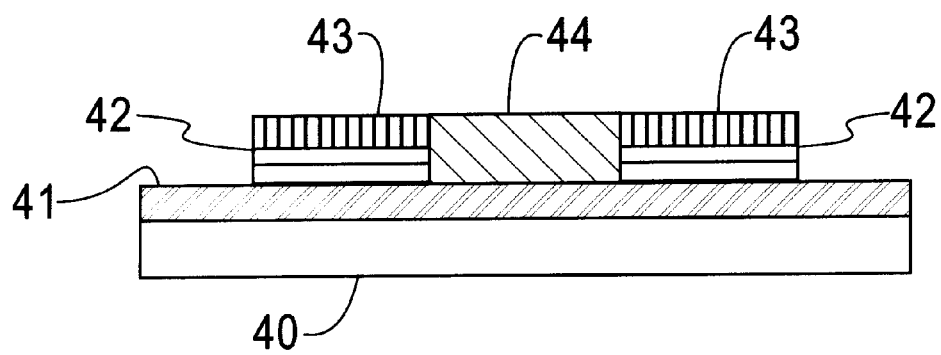
FIG. 4 shows schematically a conformationally adaptive layer in accordance with the invention used within a field effect transistor structure.

Referring to FIG. 4, a thin film field effect transistor (FET) based on the present invention is shown. A substrate 40 fabricated from heavily n-type doped silicon is oxidized to leave a 300 nm thick layer 41 of silicon dioxide on one surface. On top of this surface, chromium (25 nm) and gold (25 nm) pads 42, 43 are deposited using lithographic techniques to give the source and drain electrodes. The substrate is wired to a UHV feed-through. A Cu-TPOB-Porphyrin film 44 is deposited through a mask to give the profile as shown in FIG. 4.

Figure 5:
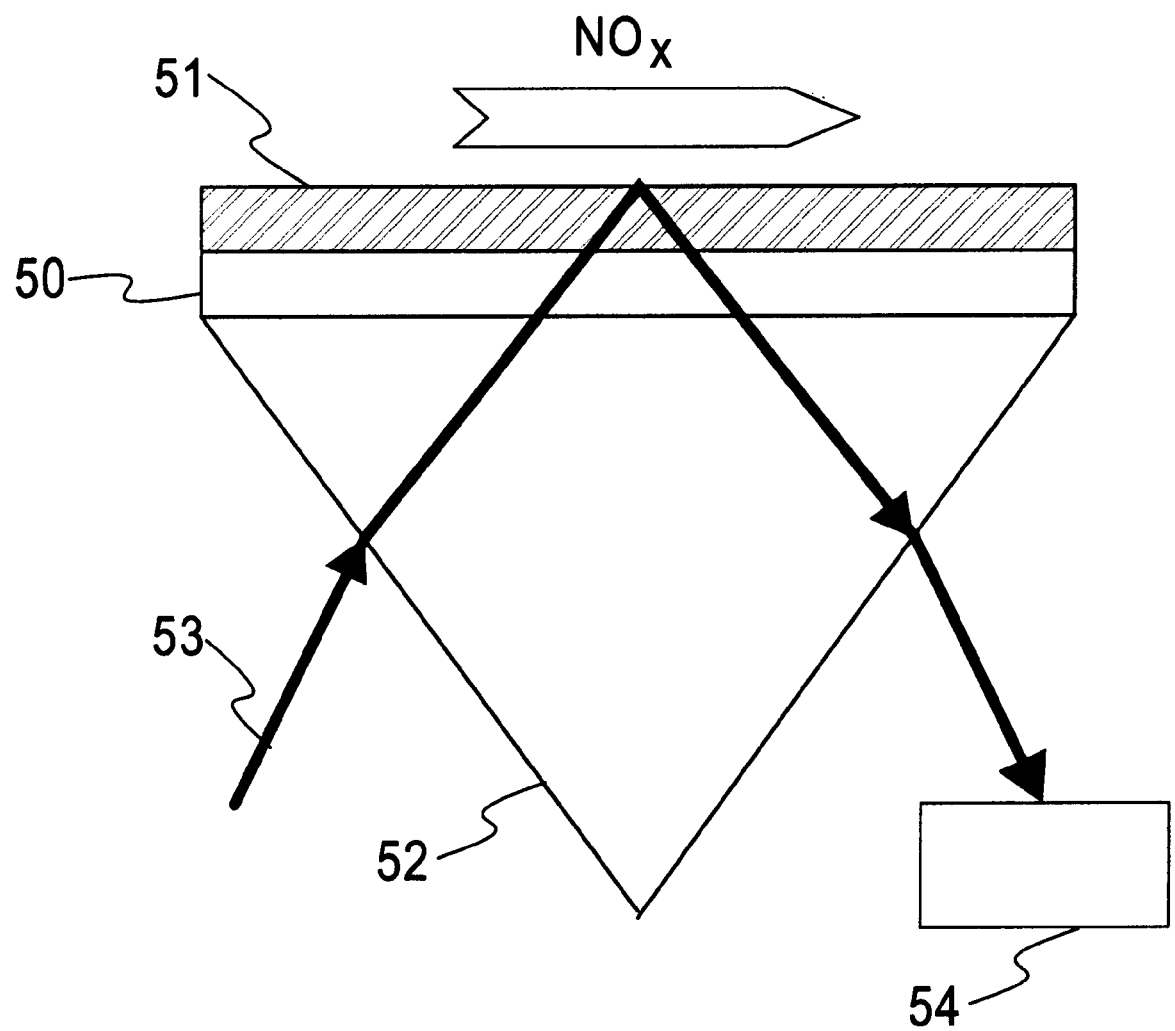
FIG. 5 shows schematically a conformationally adaptive layer in accordance with the invention used in a gas sensor.

A simple gas sensor, as shown in FIG. 5, is realized by using an effect known as surface plasmon resonance (SPR), occurring at the interface of a metal and a dielectric. The SPR effect is sensitive to changes in the refractive index of the dielectric layer. These changes occur when another species is adsorbed from the adjacent phase (gas, liquid). In the sensor of FIG. 5, a silver film 50 is evaporated onto the base of a glass prism 52 and covered by sublimation of one to five monolayers of Cu-TPOB-Porphyrin 51. A ray of light 53 is guided through the device and detected by a photodetector 54.

We claim:

1. An epitaxially layered structure comprising two layers of nonorganic crystalline material with mismatched lattice structures and one additional layer between said two layers for accommodating the lattice mismatch between said two layers with the additional layer have a structure of at least one layer of conformationally adaptive organic molecules having a main unit with a plurality of subunits forming conformal ligands.

2. The structure of claim 1, wherein said conformationally adaptive molecules each comprise one main unit and at least three subunits.

3. The structure of claim 2, wherein the main unit is a molecule selected from a group consisting of naphthalenes, phenanthrenes, perylenes, anthracenes, fullerenes, coronenes, pyrenes, phthalocyanines, porphyrins, carbazoles, purines, pterins and derivatives thereof.

4. The structure of claim 2, wherein the subunits are molecules selected from a group consisting of alkanes, benzene, and condensed polycyclic aromatic molecules.

5. Method for reducing the lattice mismatch between two layers of an epitaxially layered structure where the two layers are both nonorganic crystalline materials, comprising the step of depositing a layer of conformationally adaptive organic molecules each having a main unit with a plurality of subunits forming conformal ligands on one of the two layers to serve as an intermediate or a buffer layer between the two nonorganic layers.

6. The method of claim 5 wherein the main unit is a molecule selected from a group consisting of naphthalenes, phenanthrenes, perylenes, anthracenes, fullerenes, coronenes, pyrenes, phthalocyanines, porphyrins, carbazoles, purines and pterins.

7. The method of claim 6, wherein each of the subunits is a molecule selected from a group consisting of alkanes, benzene, and condensed polycyclic aromatic molecules.

8. An epitaxially layered structure characterized by having at least two layers in contact with one another one layer being of an inorganic material with a crystalline structure and the other layer of conformationally adaptive organic molecules each having a main unit with a plurality of subunits forming conformal ligands wherein said other layer comprises a thin film of 1 to 5 monolayers of Cu-tetra-[3.5 di-tertiary-butylphenyl]-porphyrin.

9. An epitaxially layered structure comprising at least two layers with mismatched lattice structures, a second layer including a substrate layer of nonorganic crystalline material and means for accommodating the lattice mismatch between said at least two layers with structure of at least one layer of conformationally adaptive organic molecules having a main unit with a plurality of subunits forming conformal ligands wherein: said substrate layer is Cu; the conformationally adaptive organic molecules comprise at least one layer of [Cu-TPOB-Phorphyrin] Cu-Tetra-[3.5 di-tertiary-butylphenyl]-Porphyrin molecules; and the [Cu-TPOB-Phorphyrin] Cu-Tetra-[3.5 di-tertiary-butylphenyl]-Porphyrin is covered by said second layer comprising an electron accepting layer of $C_{60}$ to form a thin film diode.

10. A thin film transistor comprising: a substrate layer of n type doped silicon with a layer of silicon dioxide thereon;

spaced contacts of chromium and gold on the silicon dioxide layer forming source and drain electrodes; and a [Cu-TPOB-Phosphyrin] Cu-tetra-[3.5 di-tertiary-butylphenyl]-porphyrin film between the source and drain electrodes.

11. An epitaxially layered structure characterized by having at least two layers in contact with one another one layer being of an inorganic material with a crystalline structure and the other layer of conformationally adaptive organic molecules each having a main unit with a plurality of subunits forming conformal ligands wherein: said one layer is silver; and said other layer is 1 to 5 monolayers of Cu-tetra-[3.5 di-tertiary-butylphenyl]-porphyrin covering the silver layer.

12. The structure of claim 11 including:

a glass prism with its base covered by the silver layer; and means for detecting the refraction of light through the glass prism.

13. An epitaxially layered structure comprising at least two nonorganic layers with mismatched lattice structures wherein one of the layers is substrate layer of nonorganic crystalline material and means for accommodating the lattice mismatch between said at least two nonorganic layers including at least one additional layer in said structure where said at least one additional layer is an intermediate buffer layer between said at least two layers, where said at least one additional layer comprises at least one laye of conformationally adaptive organic molecules having a main unit with plurality of subunits forming conformal ligands.

* * * * *